(12) United States Patent
Babcock

(10) Patent No.: US 6,630,404 B1
(45) Date of Patent: Oct. 7, 2003

(54) REDUCING FEATURE DIMENSION USING SELF-ASSEMBLED MONOLAYER

(75) Inventor: Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/097,819

(22) Filed: Mar. 14, 2002

Related U.S. Application Data

(60) Provisional application No. 60/275,660, filed on Mar. 14, 2001.

(51) Int. Cl.$^7$ .............................................. H01L 21/311
(52) U.S. Cl. ...................................................... 438/694
(58) Field of Search ................................ 438/694–704, 438/800; 430/324, 325

(56) References Cited

U.S. PATENT DOCUMENTS

| | | | |
|---|---|---|---|
| 5,079,600 A | 1/1992 | Schnur et al. ................... | 357/4 |
| 5,727,977 A | 3/1998 | Maracas et al. ............... | 445/24 |
| 6,087,231 A | 7/2000 | Xiang et al. ................. | 438/287 |
| 6,114,099 A * | 9/2000 | Liu et al. ....................... | 430/324 |
| 6,174,775 B1 | 1/2001 | Liaw ........................ | 438/283 |
| 6,187,657 B1 | 2/2001 | Xiang et al. ................ | 438/596 |
| 6,225,658 B1 | 5/2001 | Watanabe .................... | 257/296 |
| 6,238,982 B1 | 5/2001 | Krivokapic et al. ......... | 438/275 |
| 6,262,456 B1 | 7/2001 | Yu et al. ...................... | 257/371 |

OTHER PUBLICATIONS

Joanna Aizenberg, Andrew J. Black and George M. Whitesides, Controlling local disorder in self–assembled monolayers by patterning the topography of their metallic supports, Nature, Aug. 27, 1998, pp. 868–871.

Self–Assembled Monolayers, printed from Internet address: http://www.ifm.liu.se/applphys/molfil . . . ject/monolayer–structure/sam/sams.html on Oct. 9, 2000, 5 pages.

Self–assembled mono–multilayers, printed from Internet address: http://www.inapg.inra.fr/ens_rech/siab/asteq/elba/salayers.htm on Nov. 14, 2000, 3 pages.

Thin Semiconductor Layers Prepared from Langmuir–Blodgett Precursor, printed from Internet address: http://www.foresight.org/Conferences/MNT6/Papers/Erokhin/ on Nov. 14, 2000, 9 pages.

Monolayer Basics, printed from Internet address: http://www.langmuir–blodgett.com/basics/faq1.htm on Nov. 14, 2000, 6 pages.

Monolayer History, printed from Internet address: http://www.langmuir–blodgett.com/basics/faq2.htm on Nov. 14, 2000, 3 pages.

(List continued on next page.)

*Primary Examiner*—Craig Thompson
(74) *Attorney, Agent, or Firm*—Foley & Lardner

(57) ABSTRACT

A method of fabricating a feature of an integrated circuit in a layer of material includes providing a layer of photoresist over the layer of material; exposing the layer of photoresist to a source of radiation to form an aperture therein, wherein the aperture has a wall; providing a self-assembled monolayer on at least a portion of the wall, wherein the self-assembled monolayer masks a portion of the layer of material; and etching the layer of material to form a feature, whereby the self-assembled monolayer prevents the portion of the layer of material from being etched.

14 Claims, 2 Drawing Sheets

OTHER PUBLICATIONS

Langmuir Blodgett Assembly, printed from Internet address: http://mmpwww.ph.qmw.ac.uk/lbassem.html on Nov. 14, 2000, 2 pages.

Lu et al., Ultrathin resist films patterning using a synchrotron radiation lithography system, Sep. 7, 1996, pp. 103–105.

Huang et al., Photopatterning of Self–Assembled Alkanethiolate Monolayers on Gold: A Simple Monolayer Photoresist Utilizing Aqueous Chemistry, Jan. 7, 1994, pp. 626–628.

Aoki et al., Molecular Patterning using Two–Dimensional Polymer Langmuir–Blodgett Films, Advanced Materials, 1997, 9, No. 4, pp. 361–364.

Oh et al., Fabrication and Photodegradation Behavior of Photosensitive Polyimide LB Film, Mol. Cryst. and Liq. Cryst. 2001, vol. 370, pp. 169–172.

Iwamoto et al., Fine Patterns of Positive–Working Resists Using a Polyimide Langmuir–Blodgett Film System, Japanese Journal of Applied Physics, vol. 30, No. 2A, Feb. 1991, pp. L218–L221.

U.S. Publication No. US2001/000629 A1, filed May 3, 2001, by Tsukamoto, entitled "Semiconductor Device and Process of Producing the Same".

* cited by examiner

REDUCING FEATURE DIMENSION USING SELF-ASSEMBLED MONOLAYER

CROSS-REFERENCE TO RELATED APPLICATIONS

This application claims the benefit of U.S. Provisional Application No. 60/275,660, filed Mar. 14, 2001.

STATEMENT REGARDING FEDERALLY SPONSORED RESEARCH OR DEVELOPMENT

Not Applicable.

FIELD OF THE INVENTION

The present specification relates generally to fabrication of integrated circuits (ICs). More specifically, the present specification relates to photolithographic techniques for fabricating features on ICs. More specifically yet, the present specification relates to a system and method of reducing a dimension of a feature in a photolithographic patterning process.

BACKGROUND

The semiconductor industry has a need to manufacture integrated circuits (ICs) with higher and higher densities of devices on a smaller chip area to achieve greater functionality and to reduce manufacturing costs. This desire for large-scale integration has led to a continued shrinking of the circuit dimensions and features of the devices.

The ability to reduce the sizes of structures, such as gates in field effect transistors (FETs), is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the size of structures. Further, advanced lithographic technologies are being developed that utilize radiation having a wavelength of 157 nm and even shorter wavelengths, such as those used in Extreme Ultra-Violet (EUV) lithography (e.g., 13 nm).

One challenge facing lithographic technology is fabricating features having a critical dimension (CD) below 100 nm. All steps of the photolithographic techniques currently employed must be improved to achieve the further reduction in feature size. One step which must be improved is the patterning of photoresist on the substrate.

In a conventional technique, light is exposed through a binary mask to a photoresist layer on a layer of material. The photoresist layer may be either a positive or a negative photoresist and can be a silicon-containing, dry-developed resist. In the case of a positive photoresist, the light causes a photochemical reaction in the photoresist. The photoresist is removable with a developer solution at the portions of the photoresist that are exposed through the mask. The photoresist is developed to clear away these portions, whereby a photoresist feature remains on the layer of material. An integrated circuit feature, such as a gate, via, or interconnect, is then etched into the layer of material, and the remaining photoresist is removed.

The linewidth of the integrated circuit feature is limited using the conventional process. For example, aberrations, focus, and proximity effects in the use of light limit the ability to fabricate features having reduced linewidth. Using a 248 nm wavelength light source, the minimum printed feature linewidth is between 300 and 150 nm, using conventional techniques.

Accordingly, what is needed is a method of reducing the linewidth of features of an integrated circuit. Further, what is needed is a system for and method of reducing the linewidth of photoresist features. Further still, what is needed is such a method which is simple and cost-effective to implement. The teachings hereinbelow extend to those embodiments which fall within the scope of the appended claims, regardless of whether they accomplish one or more of the above-mentioned needs.

SUMMARY

According to an exemplary embodiment, a method of fabricating a feature of an integrated circuit in a layer of material includes providing a layer of photoresist over the layer of material and exposing the layer of photoresist to a source of radiation to form an aperture therein. The aperture has a wall. The method also includes providing a self-assembled monolayer on at least a portion of the wall, wherein the self-assembled monolayer masks a portion of the layer of material, and etching the layer of material to form a feature. The self-assembled monolayer prevents the portion of the layer of material from being etched.

According to another exemplary embodiment, an integrated circuit has a hole in a layer of material. The hole is manufactured by the steps of providing a layer of photoresist over the layer of material, exposing the layer of photoresist to a source of radiation to form an aperture therein, adsorbing a self-assembled monolayer to at least a portion of the aperture surface, and etching the layer of material through the aperture to form a hole in the layer of material.

According to yet another exemplary embodiment, a method of masking and etching a layer of material on a substrate includes providing a layer of material over the substrate, providing a photoresist layer having an aperture therein over the layer of material, and adsorbing a self-assembled monolayer to the wall of the aperture. The self-assembled monolayer has a structure and chemical composition suitable for preventing a portion of the layer of material from being substantially affected by an etching process. The method can also include etching the layer of material with the etching process.

DETAILED DESCRIPTION OF THE EXEMPLARY EMBODIMENTS

Figure 1:
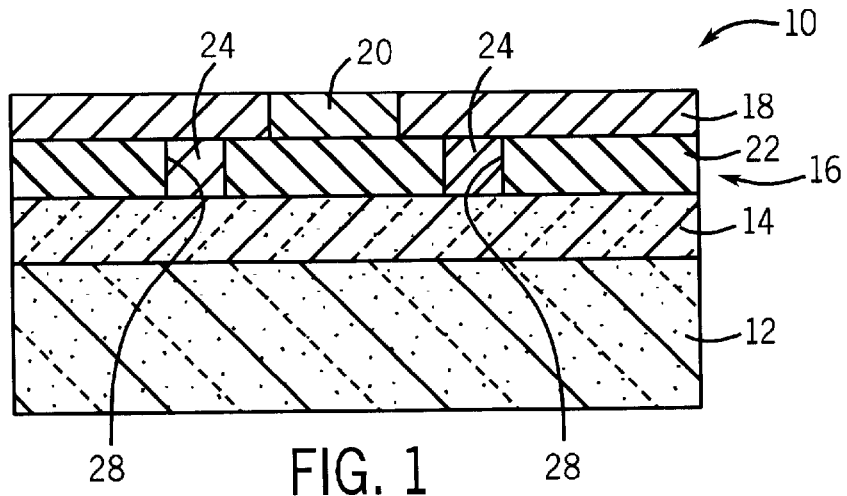
FIG. 1 is a schematic cross-sectional view of a portion of an integrated circuit, according to an exemplary embodiment.

Referring first to FIG. 1, a portion 10 of an integrated circuit is illustrated in an exemplary embodiment. Portion 10 includes a contact layer having vias for providing electrical conductivity between two or more layers of an integrated circuit. While the exemplary embodiments disclosed hereinbelow are shown and described with reference to a contact layer of an integrated circuit, the teachings may be extended to other applications of fabricating features having a reduced dimension, such as, trenches, interconnect lines, shallow trench isolation structures, masks, reticles, glass or quartz substrates, etc.

Portion 10 includes a semiconductor substrate 12 comprising silicon, germanium, gallium arsenide, or other semiconductive material. Layers 14 represent one or more other fabricated layers provided over semiconductor substrate 12, and may include transistors, interconnects, capacitors, resistors, gates or other insulative, conductive, or semiconductive structures. A contact layer 16 provides electrical conductivity between layers 14 and other layers of the integrated circuit.

In this exemplary embodiment, an interconnect layer 18 includes interconnect lines or conductive paths configured to carry electrical signals to and/or from other portions of integrated circuit 10. Thus, interconnect layer 18 includes one or more conductive portions and one or more insulative portions, such as, insulative portion 20.

According to one embodiment, interconnect layer 18 can be a metal 1 layer and layer 14 can be a polysilicon (poly 1) layer. Contact layer 16 can be an insulation (ILDO) layer. Alternatively, layer 18 can be a metal 2 layer and layer 14 can be a metal 1 layer. The principles of the present invention can be utilized on various layers of the integrated circuit.

Contact layer 16 includes an insulative layer 22, such as, an oxide, $SiO_2$, nitride, or other insulative material. Contact layer 16 further includes one or more electrical contacts 24 configured to carry electrical signals between layers 14 and conductive layer 18. Electrical contacts 24 may comprise any conductive material, such as, aluminum, titanium, doped silicon, polysilicon, copper, etc., and may be cylindrically shaped, having a circular cross-section, rectangularly shaped, having a square or rectangular cross-section, or other shapes and sizes. Electrical contacts 24 are disposed within contact holes or vias 28, which are disposed within insulative layer 22.

In conventional techniques, the dimensions of electrical contacts 24 are limited by conventional lithographic techniques used to fabricate electrical contacts 24. Thus, the critical dimension (CD) of electrical contacts 24, such as a width or a length, is limited, typically to 120 nanometers (nm) or greater. Reducing the dimensions of these features is difficult using conventional processes. However, using the processes described hereinbelow, electrical contacts 24 may be fabricated with a width or dimension of less than 120 nm, or between 50 and 100 nm. Advantageously, this allows further reduction in the size of portion 10, allowing additional circuit complexity and functionality within the same semiconductor space. The teachings hereinbelow may be applied to other features on an integrated circuit in addition to the electrical contact features shown in this exemplary embodiment.

Figure 2:
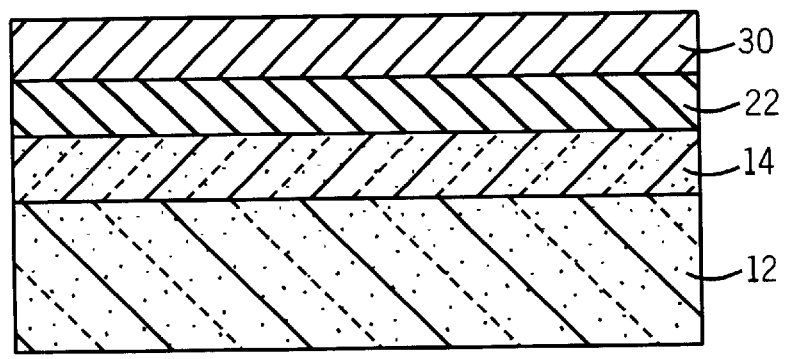
FIG. 2. is a schematic cross-sectional view of the integrated circuit of FIG. 1, illustrating a photoresist providing step, according to an exemplary embodiment.

Referring now to FIG. 2, an insulative layer 22 is provided over layers 14. Insulative layer 22 may be provided by chemical vapor deposition (CVD), physical vapor deposition (PVD), or another deposition process. Insulative layer 22 is provided with a thickness of between 60 and 200 nm.

A layer of photoresist 30 is applied over insulative layer 22. Photoresist layer 30 includes any material which may react in response to an exposure to radiation. Photoresist 30 may be a positive photoresist or a negative photoresist. Photoresist 30 is applied by spin-coating in this exemplary embodiment, and may have a thickness of between 60 and 200 nm.

Figure 3:
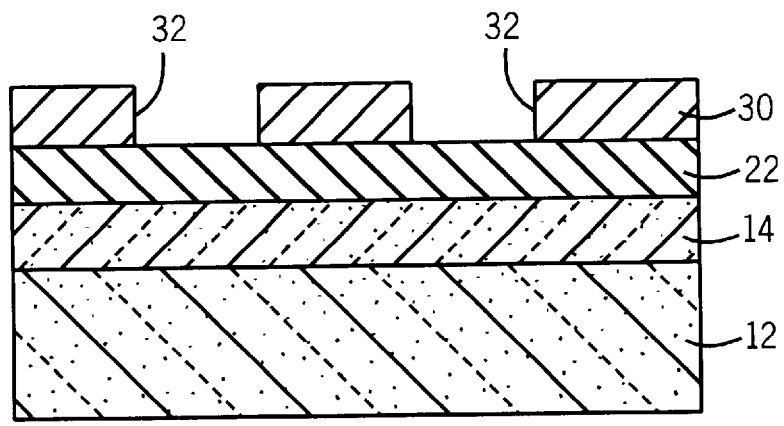
FIG. 3 is a schematic cross-sectional view of the integrated circuit of FIG. 1, illustrating a photoresist exposure and developing step, according to an exemplary embodiment.

Referring now to FIG. 3, photoresist layer 30 is exposed to a source of radiation. The radiation source may be an excimer laser having a wavelength of 248 nm, 193 nm, or 157 nm. For example, a photolithographic system, such as, the PAS 5500 stepper, manufactured by ASML, Veldhoven, The Netherlands may be used. Other photolithographic systems may also be used. The source of radiation is provided through a mask or reticle, which may be a binary mask having a glass or quartz base portion and a chromium layer patterned thereon. Alternatively, the mask may be an alternating phase shift mask, attenuating phase shift mask, or other mask.

Preferably, state of the art lithographic techniques are used to fabricate apertures 32 in photoresist 30 to provide photoresist features having the smallest possible dimensions. For example, the width of apertures 32 may be as little as 120 nm using conventional techniques.

Figure 4:
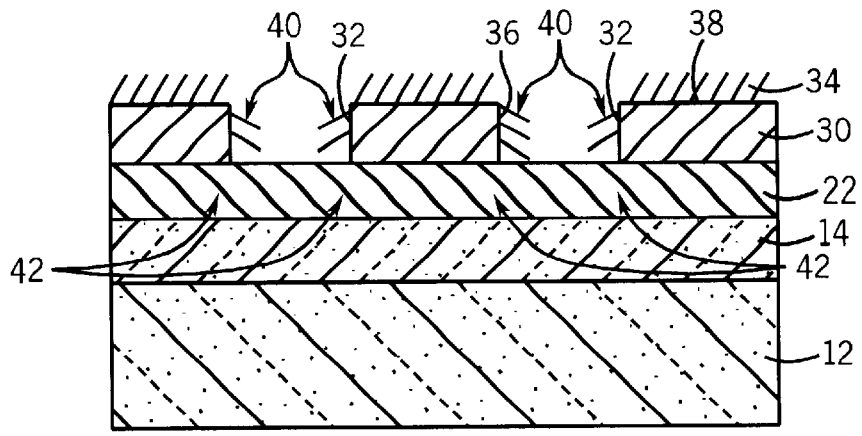
FIG. 4 is a schematic cross-sectional view of the integrated circuit of FIG. 1, illustrating a self-assembled monolayer providing step, according to an exemplary embodiment.

Referring now to FIG. 4, an advantageous aspect of this exemplary embodiment is illustrated. A self-assembled monolayer 34 is provided in this step. A self-assembled monolayer is a layer of molecules, each molecule having an alkane chain, typically with 10 to 20 methylene units. Each molecule has a head group with a strong preferential adsorption to the substrate used, in this case, photoresist layer 30. One suitable head group is a thiol (S—H) group which works well with a material having gold or silver. Accordingly, photoresist material 30 may include a quantity of gold or silver therein. The thiol molecules adsorb readily from a solution onto the photoresist, creating a dense monolayer with the tail group pointing outwards from the surface, typically at an angle. By using self-assembled monolayer molecules with different tail groups, the resulting chemical surface functionality can be varied. Alternatively, photoresist layer 30 can be a silicon-containing, dry-developed resist, and the self-assembled monolayer can be made of octadecyl fumarate, which can be deposited from a solution of chloroform (30% to 70% by volume) and methanol (70% to 30% by volume). In place of octadecyl fumarate, one could substitute analogous compounds with longer or shorter hydrocarbon tails, including 20-carbon, 22-carbon, 16-carbon, 14-carbon, or 12-carbon.

Self-assembled monolayer 34 is adsorbed or otherwise provided on at least a portion of a wall of apertures 32 in photoresist 30. Wall 36 may be curved or flat, depending upon the desired structure of the corresponding contact hole to be fabricated. Self-assembled monolayer 34 is further provided on a top surface 38 of photoresist layer 30. Providing self-assembled monolayer 34 on top surface 38 is optional, but may be an easier process than applying it to only wall 36. Self-assembled monolayer 34 may be grown to a length or thickness of between 20 and 40 nm. Thus, the width of apertures 32 is reduced from the conventional size by between 40 and 80 nm to allow fabrication of a smaller feature in layer of material 22. The length or thickness of self-assembled monolayer 34 may be controlled by the duration of time that photoresist layer 30 is exposed to the self-assembled monolayer molecular solution. For example, a time period of between 30 and 120 seconds may be suitable. Preferably, self-assembled monolayer 34 has a sufficient structure and chemical composition to provide an etchant mask over at least a portion of layer 22.

According to one alternative embodiment, photoresist layer 30 may be replaced with a different layer of material, such as a metal, gold, silver, or other material, which may act as a hard mask when etching insulative layer 22 in a subsequent step. For example, photoresist layer 30 may be a layer of gold or silver which is masked and etched to form apertures 32. Self-assembled monolayer 34 may then be grown on the gold or silver layer to form the self-assembled monolayer after the photoresist is stripped. As a further alternative, photoresist layer 30 may be replaced by an insulative layer of material similar to insulative layer 22. The portion of the self-assembled monolayer on top surface 32 also prevents the etchant from affecting layer 30 because self-assembled monolayer 34 blocks etchant from affecting insulative layer 22.

A portion 40 of the self-assembled monolayer is provided on walls 36 of aperture 32. This portion of self-assembled monolayer masks a portion of insulative layer 22. Thus, when insulative layer 22 is etched, portions 40 of self-assembled monolayer 34 prevent the etchant from affecting portions 42 of insulative layer 22. This results in a narrower or smaller feature dimension for the feature or contact hole fabricated in insulative layer 22.

Figure 5:
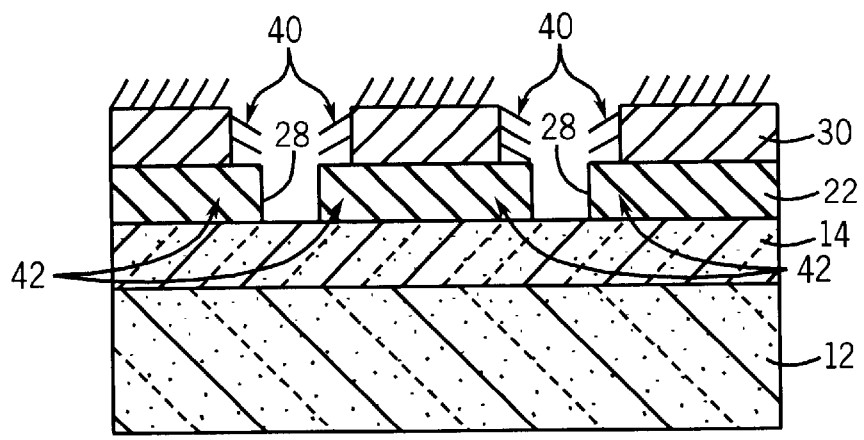
FIG. 5 is a schematic cross-sectional view of the integrated circuit of FIG. 1, illustrating an etching step, according to an exemplary embodiment.

Referring now to FIG. 5, after self-assembled monolayer 34 is provided, at least at portions 40, insulative layer 22 is etched by providing an etchant over photoresist layer 30 and insulative layer 22. The etchant is stopped by the chemical properties of the self-assembled monolayer, such that portions 42 of insulative layer 22 below portions 40 are not etched, while contact holes 28 are etched by the etchant. The etchant may be a wet etchant or a dry etchant, or other known etching procedure. Preferably, the etch process is selected to etch insulative layer 22 but not layer 14.

Figure 6:
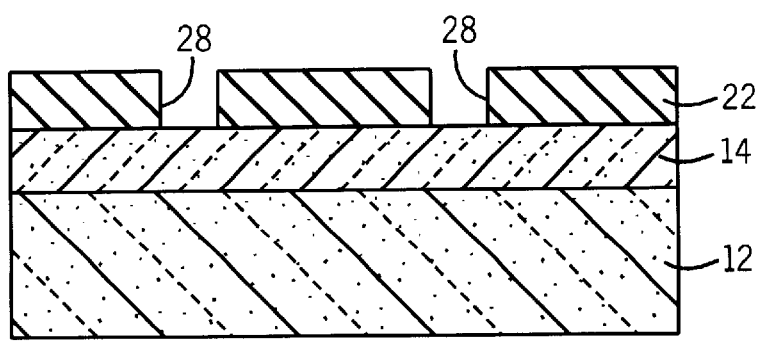
FIG. 6 is a schematic cross-sectional view of the integrated circuit of FIG. 1, illustrating self-assembled monolayer removal and photoresist removal steps.

Referring now to FIG. 6, self-assembled monolayer and photoresist layer 30 are both removed with a solvent stripping, plasma ashing, and/or other chemical stripping process.

Referring now to FIG. 1, contact holes 28 are filled with a conductive material (e.g., aluminum, doped polysilicon, titanium, copper, etc.) by any type of deposition process (e.g., conformal deposition), such as, CVD, PVD, sputtering or other processes. The conductive material forms electrical contacts 24. Conductive layer 18 is fabricated over electrical contacts 24, and insulative portion 20 may also be fabricated using conventional fabrication techniques.

While the exemplary embodiments illustrated in the FIGS. and described above are presently preferred, it should be understood that these embodiments are offered by way of example only. For example, while the self-assembled monolayer includes an alkane chain in this exemplary embodiment, other molecular structures are contemplated, now known or later developed. Any self-assembled monolayer or similar structure may be used. Accordingly, the present invention is not limited to a particular embodiment, but extends to various modifications that nevertheless fall within the scope of the appended claims.

What is claimed is:

1. A method of fabricating a feature of an integrated circuit in a layer of material, comprising:

providing a layer of photoresist over the layer of material;

exposing the layer of photoresist to a source of radiation to form an aperture therein, wherein the aperture has a wall;

providing a self-assembled monolayer on at least a portion of the wall, wherein the self-assembled monolayer masks a portion of the layer of material; and etching the layer of material to form a feature, whereby the self-assembled monolayer prevents the portion of the layer of material from being etched.

2. The method of claim 1, wherein the feature is a contact hole.

3. The method of claim 2, wherein the contact hole has a width of less than 100 nm.

4. The method of claim 3, wherein the layer of material is an insulative layer.

5. The method of claim 1, wherein the self-assembled monolayer is further provided over a top surface of the layer of photoresist.

6. The method of claim 1, wherein the self-assembled monolayer has a thickness of at least 300 angstroms.

7. The method of claim 1, wherein the step of exposing includes exposing the layer of photoresist through a mask having a pattern of apertures suitable for forming a plurality of contact holes.

8. The method of claim 1, wherein the feature is a trench.

9. A method of fabricating a feature of an integrated circuit in a layer of material comprising:

providing a layer of photoresist over the layer of material;

exposing the layer of photoresist to a source of radiation to form an aperture therein, wherein the aperture has a surface;

providing a self-assembled monolayer to at least a portion of the surface; and etching the layer of material through the aperture to form a hole in the layer of material.

10. The method of claim 9, wherein the self-assembled monolayer has a thickness of at least 30 nm.

11. The method of claim 10, wherein the self-assembled monolayer includes a molecule.

12. The method of claim 9, further comprising filling the hole with conductive material.

13. The method of claim 9, wherein the portion of the surface is curved.

14. The method of claim 9, wherein the step of exposing includes exposing the layer of photoresist through a mask having a pattern of apertures suitable for fabricating a plurality of contact holes.

* * * * *